(12) United States Patent
Quartiroli et al.

(10) Patent No.: US 9,755,658 B2
(45) Date of Patent: *Sep. 5, 2017

(54) METHOD AND A DEVICE FOR ANALOG-TO-DIGITAL CONVERSION OF SIGNALS, CORRESPONDING APPARATUS

(71) Applicant: STMICROELECTRONICS S.R.L., Agrate Brianza (IT)

(72) Inventors: Matteo Quartiroli, Broni (IT); Salvatore Poli, Milan (IT); Roberto Faravelli, Pavia (IT); Giovanni Carlo Tripoli, Rho (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/275,836

(22) Filed: Sep. 26, 2016

(65) Prior Publication Data

US 2017/0012635 A1 Jan. 12, 2017

Related U.S. Application Data

(63) Continuation of application No. 14/863,194, filed on Sep. 23, 2015, now Pat. No. 9,455,732.

(30) Foreign Application Priority Data

Dec. 19, 2014 (IT) ............................... TO2014A1069

(51) Int. Cl.
*H03M 1/00* (2006.01)
*H03M 1/12* (2006.01)
(Continued)

(52) U.S. Cl.
CPC .......... *H03M 1/124* (2013.01); *H03M 1/002* (2013.01); *H03M 1/1225* (2013.01);
(Continued)

(58) Field of Classification Search
CPC .. H03M 1/00; H03M 1/12; H03M 2201/1109; H03M 3/458; H03M 2201/11;
(Continued)

(56) References Cited

U.S. PATENT DOCUMENTS 4,724,420 A 2/1988 Woodard
4,835,721 A * 5/1989 Becker .................. G06F 1/0328
708/250

(Continued)

*Primary Examiner* — Jean B Jeanglaude
(74) *Attorney, Agent, or Firm* — Seed IP Law Group LLP

(57) ABSTRACT

One or more first signals and one or more second signals, wherein the second signal(s) are slowly varying or low frequency signals in comparison with the first signals and are converted from analog to digital by sampling the first signals and the second signals to produce samples thereof for analog-to-digital conversion, subjecting the samples of the first signals to conversion to digital at a certain conversion rate, subjecting the samples of the second signal to conversion to digital by segments so that these segments are subjected to conversion to digital along with the samples of the first signals at the respective conversion rate, and reconstructing digital converted samples of the second signal from the segments subjected to conversion to digital.

20 Claims, 3 Drawing Sheets

(51) Int. Cl.
    *H03M 1/46*     (2006.01)
    *H03M 1/38*     (2006.01)
    *H03M 1/14*     (2006.01)

(52) U.S. Cl.
    CPC ........... *H03M 1/1285* (2013.01); *H03M 1/38* (2013.01); *H03M 1/46* (2013.01); *H03M 1/144* (2013.01)

(58) Field of Classification Search
    CPC ......... H03M 2201/20; H03M 2201/51; H03M 1/002; H03M 1/1285; H03M 1/46
    USPC .......................................... 341/155, 156, 110
    See application file for complete search history.

(56) References Cited

U.S. PATENT DOCUMENTS

| | | | |
|---|---|---|---|
| 5,136,618 A * | 8/1992 | Wright, Jr. | H04B 1/66 358/1.9 |
| 5,455,579 A | 10/1995 | Bennett et al. | |
| 6,166,675 A | 12/2000 | Bright | |
| 6,445,317 B2 | 9/2002 | Lundin et al. | |
| 6,567,031 B1 * | 5/2003 | Rezvani | H03M 1/20 341/161 |
| 6,788,746 B1 * | 9/2004 | Mack | G01J 11/00 375/316 |
| 2011/0294453 A1 | 12/2011 | Mishali et al. | |
| 2012/0010879 A1 * | 1/2012 | Tsujino | G10L 19/06 704/203 |
| 2014/0062734 A1 | 3/2014 | Thiagarajan et al. | |

\* cited by examiner

METHOD AND A DEVICE FOR ANALOG-TO-DIGITAL CONVERSION OF SIGNALS, CORRESPONDING APPARATUS

BACKGROUND

Technical Field

The description relates to techniques for analog-to-digital conversion (ADC) of signals.

One or more embodiments may apply to analog-to-digital converter devices intended to convert very slow low frequency signals along with fast variable or high frequency signals.

Description of the Related Art

Certain applications, e.g., in the automotive field, may involve analog-to-digital conversion of a slowly varying temperature signal along with e.g., fast variable acceleration signals.

BRIEF SUMMARY

In the context considered in the foregoing, the need is felt for arrangements which may permit converting low frequency signals along with high frequency signals without significantly reducing the sampling frequency or increasing system requirements, possibly by using a single converter device, without appreciable penalty in terms of silicon area and power consumption.

One or more embodiments satisfy such a need.

One or more embodiments may refer to a method or to a corresponding converter device and corresponding apparatus including such a converter device.

The claims are an integral part of the disclosure of one or more exemplary embodiments as provided herein.

One or more embodiments may be based on the recognition that if a low frequency signal is converted along with one or more high frequency signals, possibly by using a same ADC converter, the sampling/conversion rate dictated by the bandwidth of the high frequency signal or signals will result in the low frequency signal remaining essentially constant between two sampling events, so that the most significant bits would remain the same. In one or more embodiments, conversion of the low frequency signal may thus be broken down in segments, thus giving rise to time-segmented conversion.

BRIEF DESCRIPTION OF THE FIGURES

One or more embodiments will now be described, purely by way of non-limiting example, with reference to the annexed figures, wherein.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

The portion of FIG. 1 indicated as a) is generally representative of one or more high frequency electrical signals such as e.g., the three components X, Y, Z of an acceleration signal being intended to be ADC converted together with a low frequency electrical signal such as e.g., temperature signal T.

Figure 1A:
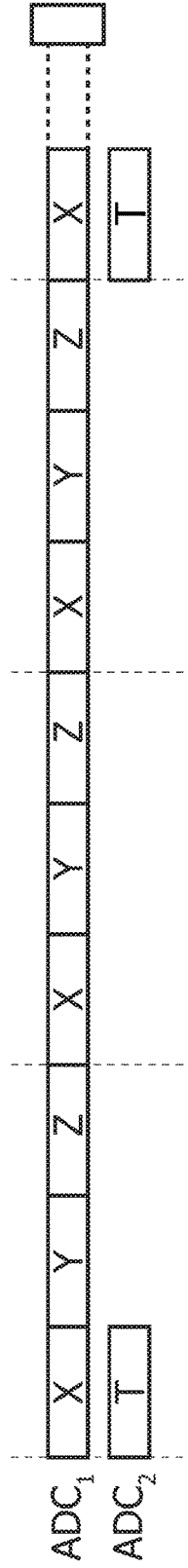
FIG. 1A is representative of a basic concept underlying one or more embodiments.

The different frequencies of the signals in question will result in the high frequency signals X, Y, Z expectedly taking different values at each one of the sampling/conversion events (whose rate will be dictated by the bandwidth of these high frequency signals, e.g., based on Nyquist's criterion). This situation is schematically represented in FIG. 1A by showing the signals X, Y, Z repeating cyclically for each sampling/conversion event at a sampling rate (frequency) $ADC_1$.

Conversely, the low frequency signal will change much more slowly, with its value hardly varying between two subsequent sampling/conversion events at the rate $ADC_1$, so that a much lower sampling/conversion rate $ADC_2$ would suffice to provide a satisfactory ADC conversion result.

Arrangements permitting conversion of both the "fast" or high frequency signals X, Y, Z and the "slow" or low frequency signal T with e.g., a single ADC converter may be involve inserting an extra slot for converting the slow signal T at each conversion of the group of fast signals X, Y, Z.

For instance, in the case of X, Y, Z being the three axes or coordinates of a three-axial acceleration signal, the slow (e.g., temperature) signal may be handled as a sort of a fourth, extra axis.

This might occur by preserving the repetition rate $ADC_1$ of the pattern of the signals X, Y, Z and "squeezing" (that is making shorter, e.g., 25% shorter) the joint duration of the intervals allotted for conversion of the X, Y, Z signals in order to accommodate an extra slot for conversion of the T signal. Such an option may end up by requiring more area and more power for each conversion.

Alternatively, the duration of the individual intervals allotted for conversion of the X, Y, Z signals may be maintained while reducing (e.g., by about 25%) the repetition rate $ADC_1$ of the pattern of the signals X, Y, Z in order again to accommodate an extra slot for conversion of the T signal. While permitting maintaining the same area and a same power for each conversion, such an option may end up by adversely affecting the performance level due to the sampling frequency being reduced.

Figure 1B:
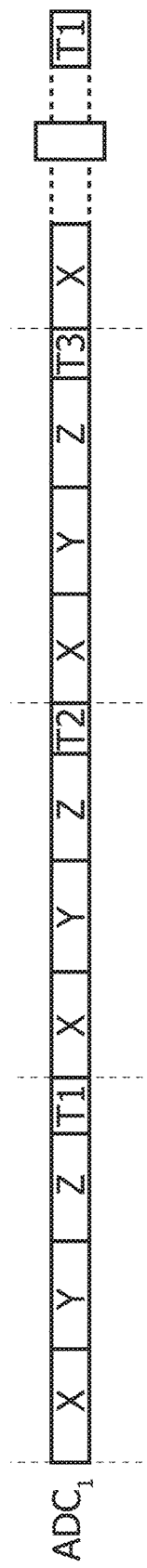
FIG. 1B is representative of a basic concept underlying one or more embodiments.

FIG. 1B is representative of one or more embodiments where the low frequency signal T may be converted along with the fast or high frequency signals X, Y, Z while hardly impacting the timing (i.e., the rate $ADC_1$) of conversion. This will permit avoiding any appreciable negative effects either in terms of increased silicon area and power consumption due to a higher drive strength if the same sampling frequency is maintained or in terms of a reduction of the sampling frequency of the "fast" or high frequency signals X, Y, Z with the same power and area.

As schematically exemplified in FIG. 1 B, in one or more embodiments, such a result may be achieved by resorting to a time-segmented conversion of the "slow" signal T, that is by performing at every cycle repeated at the fast rate $ADC_1$ dictated by the signals X, Y, Z not the entire conversion of T, but just the conversion of a "segment" T1, T2, T3, that is only a part of it starting from bits of previous parts, so that only few bits will be generated at each cycle for T while the word (that is the digital converted value) for T will be digitally reconstructed from the partial results of segmented conversion.

For instance, one may consider the case of a slow varying signal T having an (analog) sampled value of, say 37 (thirty-seven) in any units, e.g., millivolt. Converted to binary, that is digital, 37 is 100101, and the digital value for T may thus be considered as including e.g., three segments, e.g., T1=10, T2=01 and T3=01.

As schematically exemplified in FIG. 1 B, conversion of T to digital may be segmented or split into three subsequent conversion operations where the conversions of T1, T2 and T3, respectively, may be interspersed between the conversion operations for X, Y, Z taking place at a fast rate, $ADC_1$, dictated by the much higher frequencies of these signals. Since T is a slow varying, low frequency signal, a reasonable confidence may exist that the converted values for the previous (MSB) segments T1 and T2 will be still valid when the final (LSB) segment T3 is converted and the digital value for T is reconstructed from T1, T2 and T3.

Since at every cycle repeated at the fast rate $ADC_1$ of the signals X, Y, Z not the entire conversion of T, but just the conversion of a "segment" T1, T2, T3 of T is performed, the time slot allotted for that purpose may be (much) shorter.

As schematically represented in FIG. 1 B, in one or more embodiments, the segments T1, T2, T3 of the second (slow or low frequency) signal T may be subjected to conversion to digital in an alternate sequence with the samples of the first (high frequency) signals X, Y, Z.

If the repetition rate $ADC_1$ is maintained, a reduced "squeezing" of the joint duration of the intervals allotted for conversion of the X, Y, Z will permit accommodating therebetween the conversion of the low frequency signal, and the possible increase in area and power will be correspondingly reduced.

Alternatively, if the duration of the individual intervals allotted for conversion of the X, Y, Z signals is maintained, the reduction in the repetition rate $ADC_1$ in order to accommodate the conversion of the T signal will be correspondingly small, with a reduced impact on performance level due to the sampling frequency being reduced.

Of course any intermediate trade-off condition between the two is at least notionally possible.

Figures 2, 3:
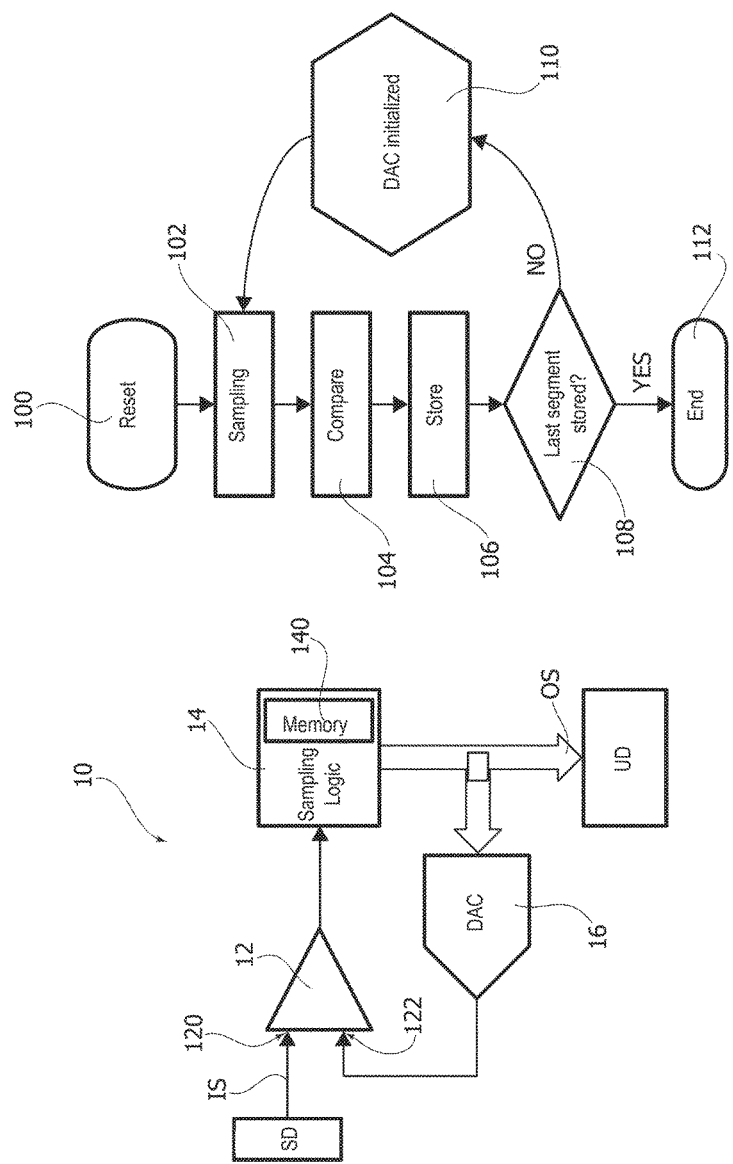
FIG. 2 is a block diagram of an ADC adapted to include one or more embodiments.
FIG. 3 is a flow chart exemplary of possible operation of one or more embodiments.

FIG. 2 is an exemplary block diagram of a Successive Approximation Register (SAR) analog-to-digital (ADC) converter 10 adapted to operate according to one or more embodiments, possibly according to the flowchart of FIG. 3.

As exemplified in FIG. 2, an ADC converter 10 according to one or more embodiments may include an input comparator 12 having first and second inputs 120 and 122.

The input signal IS injected into the input 120 may include one or more first "fast" or high frequency signals (e.g., signals X, Y, Z which vary rapidly over time: three-axial acceleration signals sensed in a moving vehicle may be exemplary of such signals), plus one or more second "slow" or low frequency signal (e.g., a signal which varies slowly over time in comparison with the fast signals: a temperature signal sensed in a vehicle along with the acceleration signals X, Y, Z may be exemplary of such a signal).

Referring herein to plural fast signals (X, Y, Z) and a single slow signal (T) is purely by way of example and for the sake of simplicity. In one or more embodiments a SAR ADC converter 10 as exemplified herein may in fact be fed with one or more "first" fast signals to be converted to digital along with one or more "second" slow signals.

In one or more embodiments, the output signal from the comparator 12 may be fed to a sampling logic 14 to produce samples of the signals X, Y, Z and the signal T.

In one or more embodiments, in view of processing the second, slowly varying signal T, the logic 14 may implement a reconstruction procedure for reconstructing a value for T from the "segments" T1, T2, T3.

In one or more embodiments, the reconstruction procedure may be of any known type, from e.g., merely reassembling the segments T1, T2, T3 to obtain T to more sophisticated arrangements including e.g., error correction codes. These reconstruction procedures are known per se, which makes it unnecessary to provide a more detailed description herein.

In one or more embodiments, the logic 14 may include or in any case be coupled to a memory 140.

The output from the logic 14 may represent the desired result of conversion, that is the output signal OS from the ADC converter 10.

The output for the logic 14 is also fed to a digital-to-analog conversion (DAC) 16 to generate the analog threshold value applied to the input 122 of the comparator 12 for comparison with the input signal IS.

The block diagram of FIG. 2 is also exemplary of an apparatus adapted to include an analog-to-digital converter 10 according to one or more embodiments in combination with either or both of:
  a source device SD of the first signals X, Y, Z and the one second signal T, and
  a user device UD receiving the first signals X, Y, Z and the second signal T once converted to digital in the analog-to-digital converter 10.

As indicated, an accelerometer with an associated temperature sensor, possibly mounted on board a vehicle, may be exemplary of such a source device SD.

A processor adapted to process the first and second signals X, Y, Z and T once converted to digital, possibly mounted on board a vehicle may be exemplary of such a user device UD.

The flow chart of FIG. 3 is exemplary of "segmented" conversion of the slow signal T.

There, the block 100 indicates an initial step where all the registers and the DAC stage 16 are reset. The block 102 is exemplary of a step where the signal is sampled to then be compared in a step 104 with a value determined as better detailed in the following. The results of comparison may be stored (e.g., in the memory 140 of FIG. 2) in a step 106.

In one or more embodiments storing may be cumulative e.g., with the result of conversion for the first segment T1 stored first, the result of conversion for the second segment T2 added thereto, and so on until the final segment T3 is converted.

To that effect, a check may be made in a step 108 as to whether the result of comparison stored includes the last segment (e.g., T3) of the signal T.

If this is not the case (e.g., the last segment T3 is not being considered yet) the step 108 yields a negative result ("no") and in a step 110 the DAC stage 16 is initialized on the basis of the result of conversion of the previous segments, e.g., T1 for the first iteration, T1+T2 for the second iteration, and so on.

Conversely, a positive result ("yes") of the step 108 will indicate that the last segment has been processed and the value stored at 106 corresponds to the reconstructed result of the conversions of T1, T2 and T3 whatever the procedure adopted for that purpose. In this situation the process then goes to step 112 and ends.

In one or more embodiments, the segments T1, T2, T3 of the second signal T may thus be converted to digital sequentially from the most significant bits, that is segment T1, towards the least significant bits, that is segment T3.

One or more embodiments may provide for at least one segment (e.g., T1, T1, and T2) being re-converted to analog (e.g., at 16) for generating the comparison threshold at input 122 used for comparing the samples of the second signal T in order to convert to digital at least one further segment (e.g., T2, T3; T3) of the second signal T.

One or more embodiments may provide for cumulatively storing (e.g., at 140) the segments already converted to digital for the second signal T, and re-converting to analog the cumulatively stored reconstructed segments for generating the comparison threshold at input 122.

In one or more embodiments, reconstructing the segments T1, T2, T3 of the second signal T subjected to conversion to digital may include cumulatively storing these segments in a memory such as e.g., 140.

Figure 4:
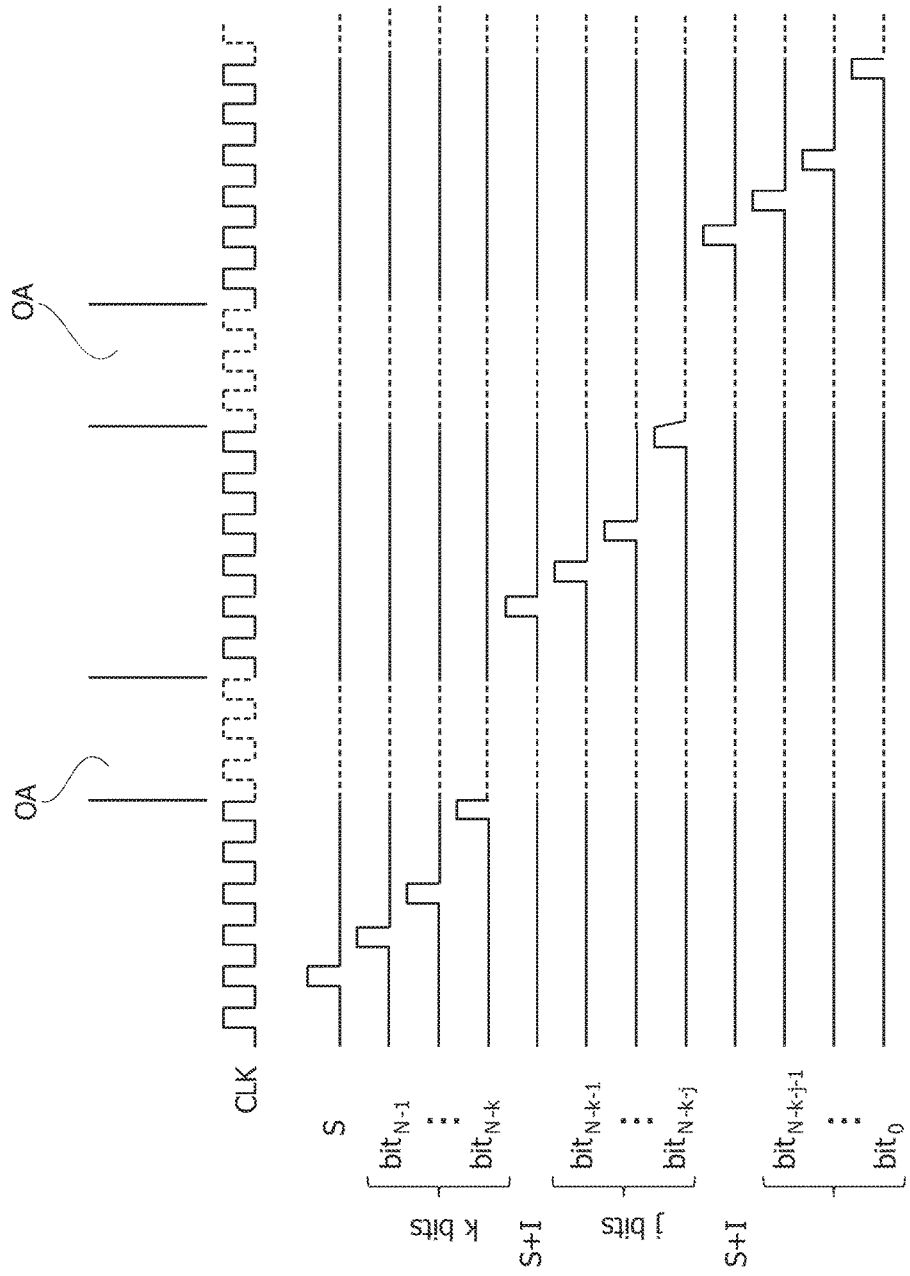
FIG. 4 is a timing diagram exemplary of signal conversion according to one or more embodiments.

The time diagram of FIG. 4 is exemplary of the degree of flexibility of one or more embodiments in permitting e.g., an arbitrary number of bits to be converted for every cycle, e.g., for each segment, while also the number of segments T1, T2, . . . may be varied, e.g., with the number of segments being adapted to be increased in the presence of a signal T which varies very slowly.

The upper line in the diagram of FIG. 4 is exemplary of the behavior of a clock signal CLK adapted to clock operation of the converter 10 with a certain frequency or rate (e.g., $ADC_1$) in converting to digital fast signals such as X, Y, Z (these may be e.g., multi-axis signals: OA=Other Axes).

The lines under the upper line of FIG. 4 are exemplary of analog-to-digital conversion of the slow signal T to, e.g., N bits from a most significant bit, $bit_{N-1}$ to a least significant bit, $b_0$.

Specifically, the lines under the upper line of FIG. 4 are exemplary of the possibility of having a sampling event S for T followed by segmented conversion of e.g.:

a first segment T1 including k bits, e.g., $bit_{N-1}$ to $bit_{N-k}$,
a second segment T2 including j (further) bits, e.g., $bit_{N-k-1}$ to $bit_{N-k-j}$, following a first sample and initialization step S+I (see block 110 in FIG. 3),
a third segment T3 including the further remaining bits, e.g., $bit_{N-k-j-1}$ to $bit_0$, following a further sample and initialization step S+I (see again block 110 in FIG. 3).

It will be appreciated that, in one or more embodiments, both the number of segments T1, T2, . . . and the number of bits k, j, . . . involved in each step can be selected as a function of specific application options and requirements.

In one or more embodiments, the segments T1, T2, T3 may thus include either a same number of bits or different numbers of bits (e.g., k, j).

One or more embodiments may offer one or more of the following advantages:

one or more ADC stages may be saved in comparison with conventional ADC converters;
area and power consumption savings may be achieved with little SAR logic overload.

The embodiments exemplified herein may be applied to a wide range of apparatus types including ADC converter stages, where low frequency signals may be converted along with other signals having a much higher frequency: motion sensors such as accelerometers, gyroscopes, and the like, possibly including environmental (e.g., temperature) sensors are exemplary of such apparatus types.

The adoption of one or more embodiments may be detected e.g., by using specific test signals. A case in point may be using as the "slow" signal T a relatively fast ramp signal. In that case, by again referring purely by way of example to conversion over three segments T1, T2 and T3, when T3 is converted the bits for the two earlier segments T1 and T2 will be "too low" for the new segment T3, so that T3 will be only capable of approximating the true value for T, without actually reaching it (since only the least significant portion will be processed at that time), while all the bits in T3 will be set to "1" since the value on input 120 will always be higher than the value on input 122.

Without prejudice to the underlying principles, the details and embodiments may vary, even significantly, with respect to what is illustrated herein purely by way of non-limiting example, without thereby departing from the extent of protection.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure and the extent of protection is determined by the claims that follow.

The invention claimed is:

1. A method, comprising:
sampling a first signal at a sampling rate to generate analog samples of the first signal;
sampling a second signal at the sampling rate to generate analog samples of the second signal, the second signal being a low frequency signal relative to the first signal;
performing conversion of the analog samples of the first signal to digital values at a conversion rate; and
performing time-segmented conversion on the analog samples of the second signal at the conversion rate to sequentially generate bits of a digital value representing the second signal.

2. The method of claim 1, wherein performing time-segmented conversion on the analog samples of the second signal at the conversion rate to sequentially generate bits of a digital value representing the second signal comprises generating N-bit segments of the digital value representing the second signal each period defined by the conversion rate along with converting the analog samples of the first signal to digital values.

3. The method of claim 2, wherein generating the N-bit segments of the second signal comprises generating the N-bit segments from the most significant bit of the digital value representing the second signal to the least significant bit.

4. The method of claim 1 further comprising:
performing digital-to-analog conversion of one of the N-bit segments of the second signal to generate an analog value of the one of the N-bit segments;
generating a comparison threshold based on the analog value of the one of the N-bit segments; and
comparing a sample of the second signal to the comparison threshold; and
performing conversion to digital a further N-bit segment of the second signal based on the comparing of the sample of the second signal to the comparison threshold.

5. The method of claim 4 further comprising:
storing each of the N-bit segments of the digital value representing the second signal; and
performing digital-to-analog conversion of the stored N-bit segments to generate the comparison threshold.

6. The method of claim 2, wherein generating N-bit segments of the digital value representing the second signal comprises generating N-bit segments where N equals one.

7. The method of claim 2, wherein generating N-bit segments of the digital value representing the second signal comprises generating a plurality of N-bit segments, each of the plurality of N-bit segments including the same number of bits.

8. The method of claim 1, wherein performing conversion and performing time-segmented conversion each comprise generating digital values through successive approximation analog-to-digital conversion.

9. An analog-to-digital converter, comprising:
a converter circuit configured to convert analog samples of a first signal and a second signal to digital values, the second signal being a low frequency signal relative to the first signal and the converter circuit configured to convert the analog samples of the first signal at a conversion rate and configured to convert the analog samples of the second signal through time-segmented conversion at the conversion rate to generate a plurality of digital segment values for the second signal; and
a reconstruction circuit configured to reconstruct a digital value of the second signal from the plurality of digital segment values for the second signal.

10. The analog-to-digital converter of claim 9, wherein the converter circuit is further configured to generate N-bit segments of the digital value representing the second signal each period defined by the conversion rate along with converting the analog samples of the first signal to digital values.

11. The analog-to-digital converter of claim 10, wherein the converter circuit is further configured to generate the N-bit segments of the digital value representing the second signal in an alternating sequence with the conversion of the analog samples of the first signal.

12. The analog-to-digital converter of claim 10, wherein the converter circuit is further configured to generate the N-bit segments from the most significant bit of the digital value representing the second signal to the least significant bit.

13. The analog-to-digital converter of claim 10, further comprising:
a digital-to-analog converter configured to convert one of the N-bit segments of the second signal to an analog value of the one of the N-bit segments and configured to generate a comparison threshold based on the analog value of the one of the N-bit segments; and
comparison circuitry configured to compare a sample of the second signal to the comparison threshold and further configured to perform analog-to-digital conversion of a further N-bit segment of the second signal based on the comparing of the sample of the second signal to the comparison threshold.

14. The analog-to-digital converter of claim 13,
wherein the reconstruction circuit is configured to cumulatively store the N-bit segments of the second signal; and
wherein the digital-to-analog converter is further configured to convert to analog the digital values of the cumulatively stored N-bit segments of the second signal to generate the comparison threshold.

15. The analog-to-digital converter of claim 13 further comprising a memory to store the N-bit segments.

16. The analog-to-digital converter of claim 9, wherein the converter circuit and reconstruction circuit are configured to collectively form a successive approximation register analog-to-digital converter.

17. An system, comprising:
an analog-to-digital converter configured to convert analog samples of a first signal and a second signal to digital values, the second signal being a low frequency signal relative to the first signal and the converter circuit configured to convert the analog samples of the first signal at a conversion rate to generate digital values of the first signal and configured to convert the analog samples of the second signal through time-segmented conversion at the conversion rate to generate a plurality of digital segment values of the second signal; and
logic circuitry configured to reconstruct a digital value of the second signal from the plurality of digital segment values of the second signal; and
a source device coupled to the analog-to-digital converter to provide the first signal and the second signal; and
a user device coupled to the analog-to-digital converter to receive the digital values of the first signal and the digital segment values of the second signal.

18. The system of claim 17, wherein the source device comprises an accelerometer to provide acceleration signals corresponding to the first signal and further comprises a temperature sensor to provide a temperature signal that corresponds to the second signal.

19. The system of claim 18, wherein the accelerometer is mounted to a vehicle and provides three acceleration signals that collectively form the first signal, and wherein the temperature sensor is also mounted to the vehicle.

20. The system of claim 19, wherein the user device comprises a processor that processes the digital values and digital segment value of the first and second signals, respectively, and wherein the analog-to-digital converter comprises a successive approximation register analog-to-digital converter.

* * * * *